United States Patent
Vorhaus et al.

(10) Patent No.: US 8,569,811 B1
(45) Date of Patent: Oct. 29, 2013

(54) SELF CLAMPING FET DEVICES IN CIRCUITS USING TRANSIENT SOURCES

(75) Inventors: James L. Vorhaus, Chapel Hill, NC (US); Anthony G. P. Marini, Clinton, MA (US)

(73) Assignee: Sarda Technologies, Inc., Durham, NC (US)

( * ) Notice: Subject to any disclaimer, the term of this patent is extended or adjusted under 35 U.S.C. 154(b) by 99 days.

(21) Appl. No.: 13/364,258

(22) Filed: Feb. 1, 2012

Related U.S. Application Data

(63) Continuation-in-part of application No. 13/270,145, filed on Oct. 1, 2011, now Pat. No. 8,274,121, which is a continuation of application No. 13/205,433, filed on Aug. 8, 2011, now Pat. No. 8,519,916.

(60) Provisional application No. 61/372,513, filed on Aug. 11, 2010.

(51) Int. Cl.
*H01L 29/78* (2006.01)

(52) U.S. Cl.
USPC .............. 257/288; 257/E29.127; 257/289; 257/401; 438/197

(58) Field of Classification Search
USPC .............. 257/E21.431, E27.111, E29.127, 257/E29.151, 76, 279, 289, 347, 401; 438/284, 286, 301, 487; 323/282, 283; 345/55, 76
See application file for complete search history.

(56) References Cited

U.S. PATENT DOCUMENTS

| | | | | |
|---|---|---|---|---|
| 5,091,817 A | * | 2/1992 | Alley et al. | 361/56 |
| 5,227,781 A | * | 7/1993 | Ninnis | 340/14.63 |
| 5,298,851 A | * | 3/1994 | DeNardis | 322/28 |
| 5,495,165 A | * | 2/1996 | Beland | 323/270 |
| 5,714,809 A | * | 2/1998 | Clemo | 307/125 |
| 5,786,685 A | * | 7/1998 | Lange et al. | 323/270 |
| 5,815,356 A | * | 9/1998 | Rodriguez et al. | 361/91.6 |
| 6,292,046 B1 | * | 9/2001 | Ali | 327/310 |
| 7,157,959 B2 | * | 1/2007 | Ball et al. | 327/427 |
| 7,251,178 B2 | * | 7/2007 | Gogl et al. | 365/209 |
| 7,313,006 B2 | * | 12/2007 | Choi | 363/56.04 |
| 8,008,960 B2 | * | 8/2011 | Arduini | 327/280 |
| 8,064,179 B2 | * | 11/2011 | Apfel | 361/90 |
| 8,203,372 B2 | * | 6/2012 | Arduini | 327/280 |
| 8,339,055 B2 | * | 12/2012 | Zhan et al. | 315/219 |

* cited by examiner

*Primary Examiner* — Chris Chu
(74) *Attorney, Agent, or Firm* — Carr & Ferrell LLP

(57) ABSTRACT

Various aspects of the technology provide for clamping a transient from a transient generator in a circuit using a Field Effect Transistor (FET) including a compound semiconductor layer forming a drain coupled to the transient voltage generator, a source, and a gate. The gate and the drain may be configured to clamp voltage transients in the circuit from the transient voltage generator independent of a clamping diode between the source and the drain. The FET may be a depletion mode type fabricated using germanium or a compound semiconductor such as gallium arsenide (GaAs) or gallium nitride (GaN).

25 Claims, 6 Drawing Sheets

Prior Art  FIG. 1A

SELF CLAMPING FET DEVICES IN CIRCUITS USING TRANSIENT SOURCES

CROSS REFERENCE TO RELATED APPLICATIONS

This application is a continuation in part and claims the priority benefit of U.S. patent application Ser. No. 13/270,145, filed Oct. 10, 2011 now U.S. Pat. No. 8,274,121 and titled "COMPOUND FIELD EFFECT TRANSISTOR WITH MULTI-FEED GATE AND SERPENTINE INTERCONNECT," which is a continuation of U.S. patent application Ser. No. 13/205,433, filed Aug. 8, 2011 now U.S. Pat. No. 8,519,916, and titled "LOW INTERCONNECT RESISTANCE INTEGRATED SWITCHES," which claims the priority benefit of U.S. provisional application No. 61/372,513, filed Aug. 11, 2010, and titled "Field Effect Transistor and Method of Making Same." The above referenced applications are hereby incorporated by reference in their entirety.

TECHNICAL FIELD

The present invention relates to semiconductors devices, and more particularly to compound semiconductor Field Effect Transistor (FET) switches and power FETs.

BACKGROUND

A common type of Field Effect Transistors (FET) is a Metal-Oxide-Semiconductor Field Effect Transistor (MOSFET), which may be fabricated using silicon. A typical circuit application for a MOSFET device is a synchronously-rectified step-down (buck) DC-DC converter output stage. FIG. 1A is a block diagram illustrating a prior art buck DC-DC converter output stage 10 using a blocking diode 12. MOSFET devices include an intrinsic body diode that is useful for blocking current surges from an inductor. Blocking diode 12 may represent the intrinsic body diode in the case when device 14 is a MOSFET device. Unfortunately, MOSFET devices are generally larger and slower to turn on than desired because it has a lot of capacitance and a relatively high rate of loss. The body diode losses are a significant factor in the overall switch loss particularly at low current loads. Additional diodes may be used to supplement current blocking inherent in the body diode of a MOSFET. Unfortunately additional diodes increase the cost of a circuit. A compound semiconductor FET (CSFET) such as a GaAs FET or GaN FET is generally not used in rectified step-down buck DC-DC converter circuits or other circuits that include transient sources such as inductors because a GaAs CSFET does not include an intrinsic body diode for blocking current surges.

SUMMARY

Transients from a source in a circuit, such as an inductor, may be clamped using a depletion mode, compound semiconductor Field Effect Transistor (FET) in the circuit. The FET may be used without a diode in the circuit or in the device for suppressing and/or clamping the transients.

Various embodiments of circuits comprise a transient voltage generator or source, and a Field Effect Transistor including a compound semiconductor layer. The compound semiconductor layer forms a drain coupled to the transient voltage generator, a source, and a gate. The gate and the drain may be configured to clamp voltage transients from the transient voltage generator independent of a clamping diode between the source and the drain.

Various aspects of a circuit comprise an inductor configured to produce a transient voltage and a body diode-less FET including a source, a gate and a drain fabricated as a depletion mode device on a compound semiconductor substrate. The drain of the FET may be configured to receive the transient voltage from the inductor and render it possible to drive the gate in response to the transient voltage to reduce resistance between the drain and the source for clamping the transient voltage.

Various aspects of a converter circuit include an enhancement mode control FET fabricated using gallium arsenide and a depletion mode sync FET coupled to the control FET, the sync FET fabricated using gallium arsenide. The converter circuit further includes an inductor configured to couple a transient voltage to a source of the control FET and a drain of the sync FET.

BRIEF DESCRIPTION OF THE DRAWINGS

FIG. 1A is a block diagram illustrating a prior art (buck) DC-DC converter output stage using a blocking diode.

DETAILED DESCRIPTION

A compound semiconductor FET device presents the user with a device possessing a new benchmark in figure of merit performance. Performance advantages that this device can deliver may be extracted from the operation of the device in an application such as the power switch(es) in a synchronously-rectified DC-DC buck converter and other circuits. A compound semiconductor FET fabricated as a depletion mode device may be used to clamp transient signals. Drive signal levels and timing of the device(s) in a synchronous buck converter application may be selected to prevent cross-conduction/shoot-through of the power switches without the use of intrinsic or extrinsic diodes to block surges from transient sources. While an example of a synchronously-rectified DC-DC buck converter is presented, a depletion mode compound semiconductor FET may be used to clamp transient signals in other circuits.

Figure 1B:
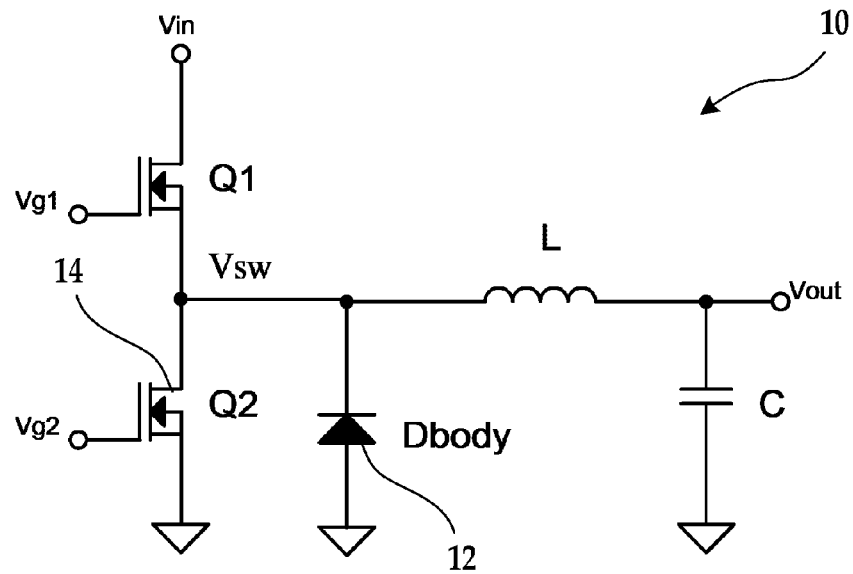
FIG. 1B illustrates a block diagram of a circuit for a synchronously-rectified power stage using a compound semiconductor FET, in accordance with embodiments of the invention.
Figure 1B:
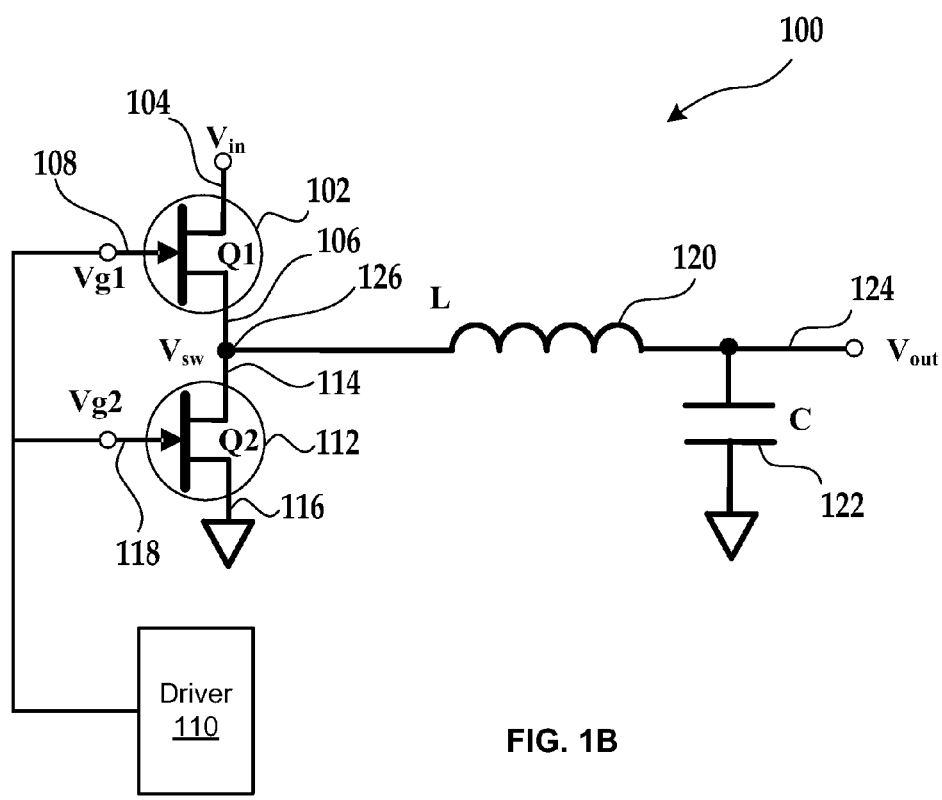
Figure 2:
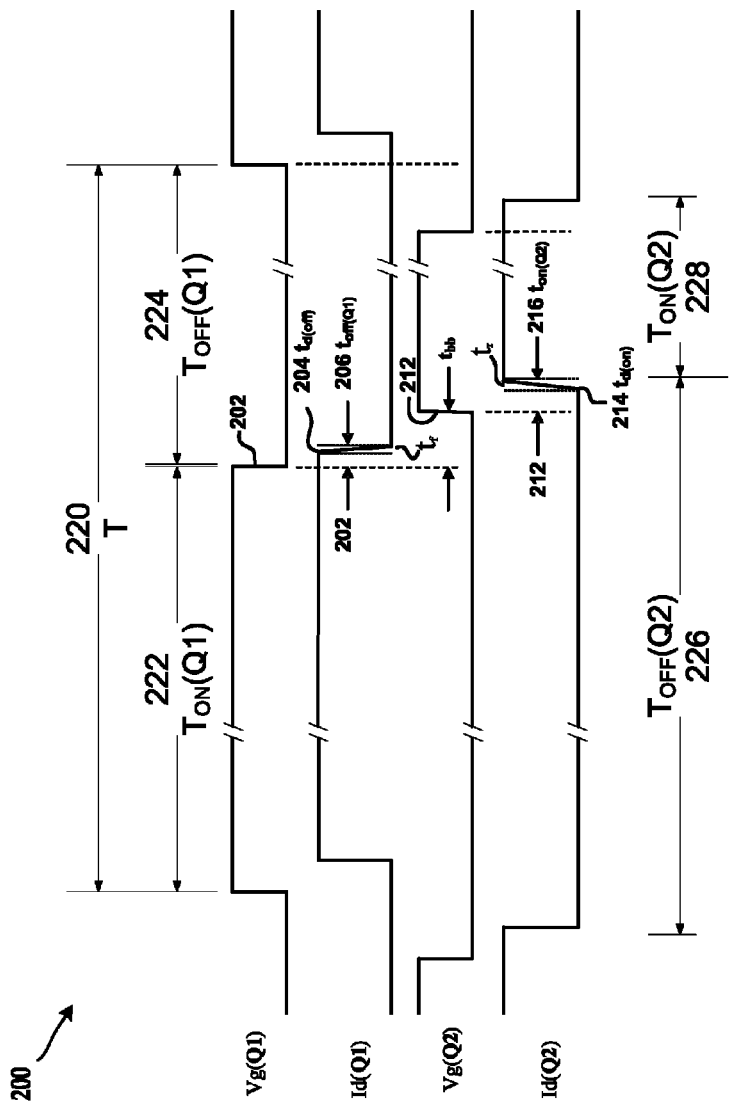
FIG. 2 illustrates a timing diagram for the circuit of FIG. 1B.

FIG. 1B illustrates a block diagram of a circuit 100 for a synchronously-rectified power stage using a compound semiconductor FET, in accordance with embodiments of the invention. FIG. 2 illustrates a timing diagram 200 for the circuit 100 of FIG. 1B. The power stage circuit 100 of FIG. 1B includes a synchronously rectified step-down (buck) DC-DC converter output stage. The circuit 100 includes a control FET 102 (Q1) and a compound semiconductor FET used as a sync FET 112 (Q2). In various embodiments, the sync FET 112 is a depletion mode device fabricated using compound semiconductor material including gallium arsenide (GaAs), gallium nitride (GaN), and/or the like. In some embodiments, the control FET 102 is also a compound semiconductor FET. The control FET 102 may be a depletion mode device or an enhancement mode device.

The circuit 100 further includes an inductor 120 (L) and a capacitor 122 (C). A drain 114 of the sync FET 112 may be coupled to the inductor 120 and a source 106 of the control FET 102. A source 116 of the sync FET 112 may be coupled to ground. A drain 104 of the control FET 102 may be coupled to an input voltage $V_{in}$. The inductor 120, drain 114 and source 106 may be coupled at a switching node 126.

A gate 118 of the sync FET 112 and a gate 108 of the control FET 102 may be coupled to a driver 110. The driver 110 is configured to apply a gate voltage $V_{g1}$ to the gate 108 of control FET 102 (e.g., turn the control FET 102 on and off), and to apply a gate voltage $V_{g2}$ to the gate 118 of the sync FET 112 (e.g., turn the control FET 102 on and off) according to timing illustrated in FIG. 2. The sync FET 112 of FIG. 1B is a depletion mode device configured for a gate pinch off voltage at about –1.0V, a gate full OFF voltage at about –2V, and a gate full ON voltage at about +0.4V, with respect to the source 116. However, the sync FET 112 may be configured for other pinch OFF voltages, ON voltages, and/or OFF voltages.

The output voltage $V_{out}$ at node 124 of circuit 100 may be determined from the duty cycle (ON time of control FET 102) from equation 1:

$$V_{out}=D*V_{in} \qquad \text{Eq. 1}$$

Where D is the duty cycle of the converter, defined in equation 2 as $$D = \frac{T_{ON(Q1)}}{T} \qquad \text{Eq. 2}$$

Where $T_{ON(Q1)}$ is the period of time 222 that control FET 102 is on, and T is the period of time 220 the clock is utilized. In some embodiments, $V_{in}$ may be about 12 V and $V_{out}$ may be about 1 volt. A time interval of interest is the time interval just after control FET 102 is turned OFF at time 202 and just prior to when sync FET 112 is turned ON at time 212, the beginning of the time interval (1-T), as shown in FIG. 2. Thus, an interval between Q1(ON) and Q2(ON) a switching interval that may be selected to prevent turning both the control FET 102 and the sync FET 112 on simultaneously.

During the ON time interval 222 of control FET 102, time $T_{ON(Q1)}$, the drain current of control FET 102, which is $I_d(Q1)$ flows through control FET 102 into the inductor L. The driver 110 may send a signal to command the gate voltage $V_g$ (Q1) at gate 108 for control FET 102 to an OFF state at time 202. In response, drain current $I_d(Q1)$ may begin to switch to an OFF state at time $t_{d(OFF)}$, or time 204. After a fall time of $t_f$ the drain current $I_d(Q1)$ through the control FET 102 into the inductor is at an OFF state at time $t_{OFF(Q1)}$, or time 206.

After a delay, the driver 110 may send a signal to command the gate voltage $V_g(Q2)$ at gate 118 for sync FET 112 to an ON state at time 212. In response, the sync FET 112 may begin to switch to an ON state at $t_{d(ON)}$, or time 214. As the sync FET 112 switches to an ON state, current begins to flow through the sync FET 112. After a rise time of $t_r$ the drain current $I_d(Q2)$ through the sync FET 112 is in an ON state at time $t_{ON(Q2)}$, or time 216.

Two time intervals are of interest. A time interval $t_{bb}$ is a delay time between time 202 and time 212, and is a delay time that may be inserted between switching OFF the control FET 102 at time 202 and switching ON the sync FET 112 at time 212 so as to avoid an uncontrolled cross-conduction of current from $V_{in}$ directly to ground through control FET 102 and sync FET 112. A time interval $t_{dt}$, which may also be referred to as the dead time, is a time when both the control FET 102 and sync FET 112 are off between time 206 and time 214. During the time $t_{dt}$ uncontrolled voltage transients from the inductor 120 may cause damage to the circuit 100.

A compound semiconductor FET does not have an intrinsic drain-source body diode as found in silicon MOSFET devices. Thus, the time interval $t_{dt}$ is of interest. During time $t_{dt}$, both control FET 102 and sync FET 112 are OFF and the inductor 120 may expose the drain of the sync FET 112 to excessive reverse, and potentially destructive, voltage. If the sync FET 112 were provisioned using a silicon MOSFET as illustrated in FIG. 1A, a body diode 12 such as is intrinsically present in silicon MOSFET devices, such as device 14, would serve to provide protection from voltage transients produced by the inductor 120 during $t_{dt}$ by clamping such negative voltage transients to the forward voltage of the body diode. However, a compound semiconductor FET such as sync FET 112 illustrated in FIG. 1B does not have a body diode.

What has not been previously appreciated is that a circuit design such as circuit 100 may use a sync FET 112 that is fabricated as a depletion mode device using compound semiconductor materials. Such sync FET 112 may be used without a diode in the circuit and without a diode fabricated into the device. The depletion mode, compound semiconductor sync FET 112 may nonetheless prevent deleterious, uncontrolled voltage or current conditions that occur in circuits having transients, such as circuit 100 during the time interval $t_{dt}$. The inventor has found a voltage clamping property that occurs in compound semiconductor FET devices that may be used instead of a MOSFET in switching circuit designs that include transient sources, such as inductor 120 of the circuit 100. A circuit may be designed to use the voltage clamping property of the compound semiconductor sync FET 112, instead of the body diode of a MOSFET, to protect a circuit from breakdown or damage resulting from transients generated, for example, in the inductor 120 of circuit 100. Thus, for example, sync FET 112 of circuit 100 may be a depletion mode device fabricated from compound semiconductor materials, and configured to clamp transient voltages from the inductor 120.

Figure 3:
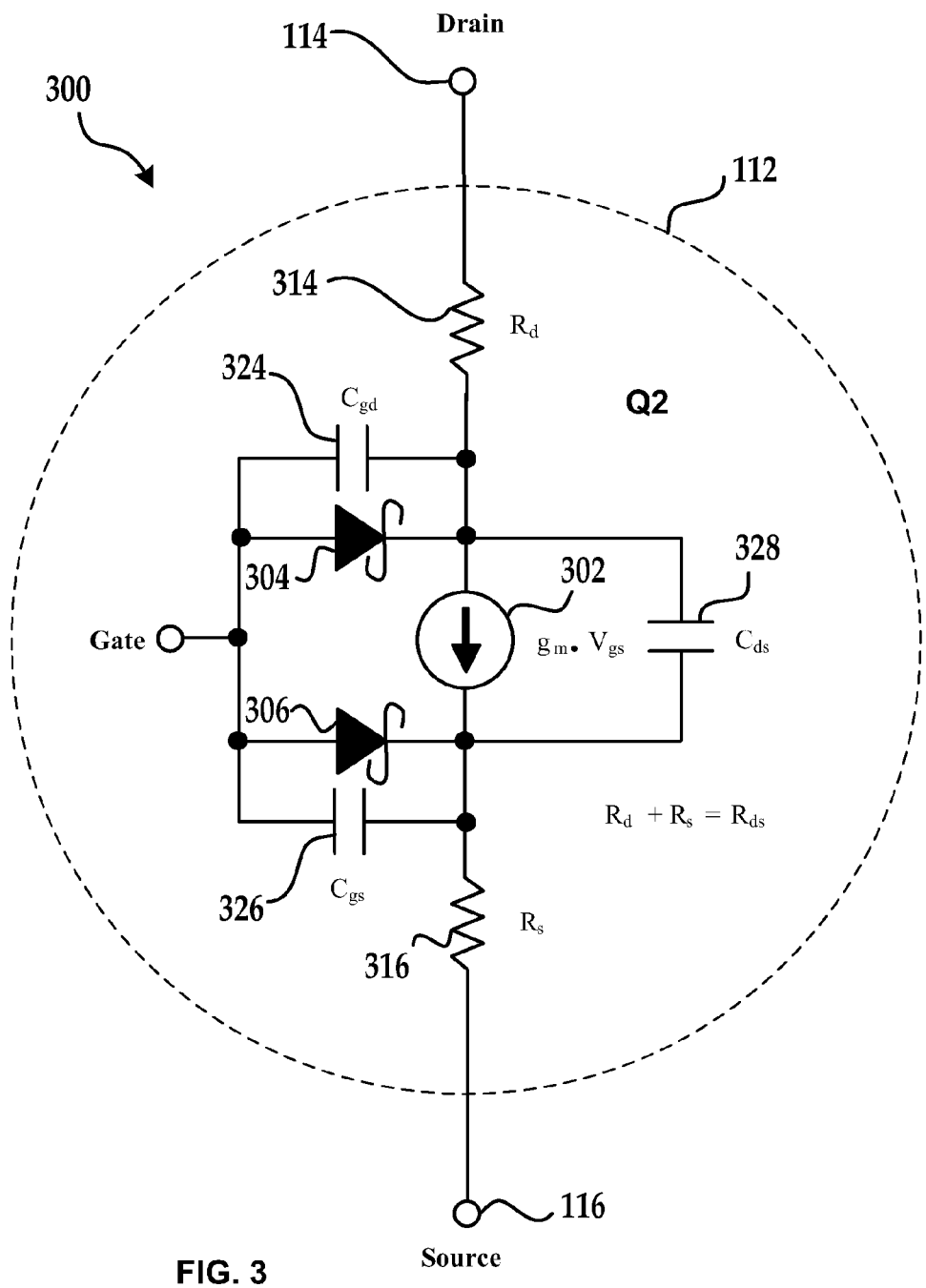
FIG. 3 is a circuit model illustrating details of an embodiment of the sync FET of FIG. 1B.
Figure 4:
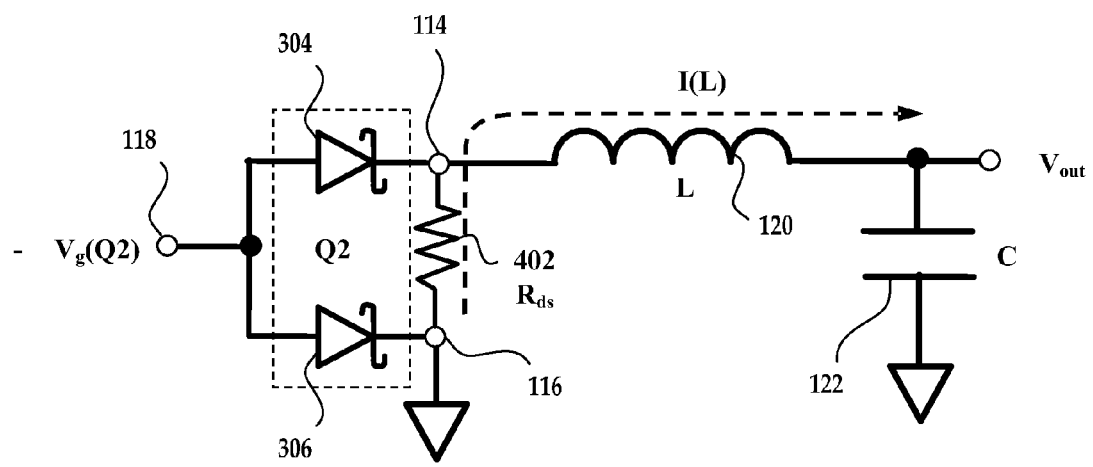
FIG. 4 illustrates details of a portion of the circuit of FIG. 1B showing portions of the circuit model of FIG. 3.

FIG. 3 is a circuit model 300 illustrating details of an embodiment of the sync FET 112 of FIG. 1B. FIG. 4 illustrates details of a portion of the circuit 100 of FIG. 1B showing portions of the circuit model 300 of FIG. 3. A look at the inter-electrode model of the sync FET 112 may aid in further understanding the circuit operation of the sync FET 112. The model 300 for sync FET 112 illustrated in FIG. 3 includes a channel 302, a drain Schottky diode 304, a source Schottky diode 306, a drain resistor 314 (Rd), and a source resistor 316 (Rs). Referring to FIG. 4, a drain-source resistor 402 ($R_{ds}$)

may be equivalent to a sum of the drain resistor 314 and the source resistor 316. That is, $R_{ds}=R_d+R_s$. When the sync FET 112 is in an ON state, resistance of the drain-source resistor 402 $R_{ds(ON)}$ may be very low, for example, about 0.01 Ohms. FIG. 4 illustrates a direction of the current I(L) during the OFF state of the control FET 102 when the drain 114 of the sync FET 112 (Q2) is at a negative voltage and sync FET 112 is either clamping the voltage at the drain 114 or in an ON state.

Referring again to FIG. 3, the model 300 further includes a gate drain capacitor 324, a gate source capacitor 326, and a drain source capacitor 328. The channel 302 may be represented by the drain-source resistor 402 in FIG. 4. The resistance between the drain 114 and the source 116 depends on voltage at the gate 118 with reference to the source 116. As the channel 302 resistance of the drain-source resistor 402 decreases, it forms a reasonably low resistance path for the negative current to flow to ground, and provides for self-clamping of the voltage across the channel 302. Voltage is described in an algebraic sense. Thus, for example, −4 volts is less than −2 volts, and +2 volts is greater than −4 volts.

During the time interval 226 that sync FET 112 is turned off, the gate 118 of circuit 100 is held at the potential $V_g$, which is a potential less than the pinch off voltage ($V_p$), which is about −1.0 volts. For example, $V_g$ (Q2) may be held at about −2 volt. When the control FET 102 turns off, at time 206, the voltage potential at the switching node 126, will make a negative excursion towards a large negative value because of transient current from the inductor 120. When the switching node 126, which is also the drain of sync FET 112, falls just below a clamping voltage, ($V_{clamp}$) the channel begins to turn to an ON state (albeit weakly) and then the voltage at the switching node 126 will become clamped at the approximately value $V_{clamp}$. $V_{clamp}$ may be determined from:

$$V_{clamp}=V_{g(Q2)}-V_{fgd} \quad \text{Eq. 3}$$

Where $V_{fgd}$ is the forward voltage of the gate-drain Schottky diode. In some embodiments, $V_g$ (Q2) is about −2V and $V_{fgd}$ is about −0.7 V. Thus, $V_{clamp}$ may be about −2.7 V.

The drain-source resistance 402 during conditions that obtain during the time interval between time 206 and time 216 may typically be about 5-10 times that of the $R_{ds(ON)}$ of the device. A typical resistance for $R_{ds(ON)}$ is about 10 milli-ohm. So, resistances on the order of 50-100 milli-ohm may describe the channel resistance $R_{ds}$.

A power dissipation during this time may be given by:

$$P_{clamp}=I_{Lp}^2 * R_{ds} * \frac{t_{dt}}{T} \quad \text{Eq. 4}$$

Where $I_{Lp}$ is the peak value of the inductor current. The peak value of the inductor current $I_{Lp}$ may be calculated from an average current ($I_{La}$) of the inductor plus one half a ripple current ($I_{Lr}$), or $$I_{Lp}=I_{La}+(0.5*I_{Lr}) \quad \text{Eq. 5}$$

For example, using some typical values:
$R_{ds}$=75 milliohms
$I_{Lp}$=23 A
$I_{La}$=20 A
$I_{Lr}$=6 A
$t_{cc}$=20 ns
T=1.33 us (a 750 kHz switching frequency)
and applying Eq. 4 and Eq. 5, the average power dissipated in the sync FET 112 is about 23 $A_2$*0.075 ohm=600 mW. A voltage to which the drain of the sync FET 112 will be clamped may be calculated as:

$$V_{clamp}=I_{La}+(0.5*I_{Lr}*R_{ds})=-23*0.075=-1.75V.$$

Since no minority carriers are involved, there is no reverse recovery time involved.

A calculation of $P_{conduction}$, which is the power dissipated by sync FET 112 due to conduction during the ON state of the sync FET 112 may be calculated from the relation:

$$P_{conduction}=I_{La}^2 * R_{ds(ON)} * \frac{T_{ON(Q2)}}{T} \quad \text{Eq. 6}$$

If an input voltage $V_{in}$ of about 12 V and an output voltage of about 1 Vdc is assumed, then the duty cycle for the converter (the ON time interval 222 of the control FET 102) is about $\frac{1}{12}$=0.083. This means that the duty cycle for the Sync FET 112 is about 1−0.083=0.917 (91.7%.). That is also the time interval 228 that sync FET 112 is in the ON state divided by the total time interval T. Note that FIG. 2 is not to scale. Assuming typical values of:
$I_{La}$=20 A, $$\frac{T_{ON(Q2)}}{T}=0.917$$

$R_{ds(ON)}$=0.01 ohm.

The conduction power during the ON state 228 of the sync FET 112 may be calculated from Eq. 6. For example, using the values above, $P_{conduction}$ conduction may be calculated to be $P_{conduction}$=400*0.01*0.917=3.67W.

A compound semiconductor may have fast switching speeds compared to other commercially-available semiconductor switching devices. In some embodiments, these times may be 3 ns for the rise time and 1 ns for the fall time. The value of $P_{switching}$ is then given by $$P_{switching}=\left(0.5*I_{La}*V_{sw}*\frac{t_r}{T}\right)+\left(0.5*I_{La}*V_{sw}*\frac{t_f}{T}\right) \quad \text{Eq. 7}$$

Where $V_{sw}$ is the voltage at the switching node 126, determined from:

$$V_{sw}=V_{clamp}-V_{conducting},$$

and $$V_{conducting}=I_{La}*R_{ds}(\text{on})$$

and $$V_{sw}=1.75-(23*0.01)=1.52V$$

Therefore $$P_{switching}=(0.5*23*1.52*0.003/1.33)+(0.5*23+1.52*0.001/1.33)=52 \text{ mW}.$$

A compound semiconductor FET may have a very low gate charge compared to other commercially-available semiconductor switching devices. In some embodiments, the gate charge is lower than about 1 nano-coulomb (nC). A typical gate charge for the sync FET 112 may be about 0.8 nC. The power loss due to gate drive associated with this charge may be calculated from the relation:

$$P_{gate}=Q_g*V_g*f_{sw} \quad \text{Eq. 8}$$

Where $Q_g$ is the total gate charge (e.g., 0.8 nC), $V_g$ is the total gate-source voltage deviation (e.g., +0.5 to −2.0V=2.5V) and $f_{sw}$ is the PWM switching frequency (e.g., 750 kHz). Given the above values, $P_{gate}$=0.8*10⁻⁹*2.5*750000=15 mW.

In some embodiments, a total power dissipation of the sync FET 112 may be calculated from the relation:

$$P_{total} = P_{clamp} + P_{conduction} + P_{gate} + P_{switching} \quad \text{Eq. 9}$$

For the above examples, the total power may be calculated as $P_{total}$=0.600+3.67+0.052+0.015=4.33W.

If an adequate copper etch layout and area are provisioned on an application printed circuit board for the sync FET 112, then this power dissipation can be safely accommodated by the device, resulting in a reliable operating temperature and high conversion efficiency.

Figure 5:
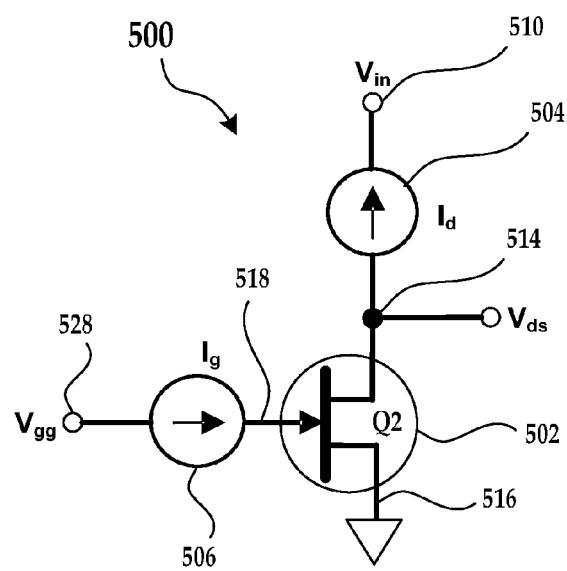
FIG. 5 illustrates a commutation configuration for a test circuit for measuring parameters of a depletion mode, compound semiconductor FET, in accordance with embodiments of the invention.

FIG. 5 illustrates a commutation configuration for a test circuit 500 for measuring parameters of a depletion mode, compound semiconductor FET 502, according to embodiments of the invention. The FET 502 includes a source 516 coupled to ground, a drain 514 coupled to a current source 504, and a gate 518 coupled to a gate voltage control 528 $V_{gg}$ fixed at −2.00 Volts. A voltage source 510 was set to −5.0V ($V_{in}$) and a fixed gate voltage of −2.00 Vdc was applied to the gate 518. The current source 504 applied a drain current (Id) from −0.1 to −5.0 amps to the drain 514. A drain-source voltage ($V_{ds}$) through the FET 502 was measured at the drain 514. A drain clamping voltage was determined to be about −1.2 volts.

A Table 1 illustrates experimental results using the circuit 500 illustrated in FIG. 5. The column labeled "$I_d$" shows the drain current in amps provided from the current source 504. The column labeled "$V_{ds}$" shows the drain-source voltage measured at the drain 514 relative to the source 516. The column labeled "$I_g$" shows the gate current in micro-amps through 506. The column labeled "Resistance" is the resistance in ohms of a channel through the FET 502 calculated from the drain current Id and the drain-source voltage $V_{ds}$. The column labeled "Power" is the power in watts calculated from the drain current Id and the drain-source voltage $V_{ds}$.

TABLE 1

| $I_d$ (A) | $V_{ds}$ (V) | $I_g$ (uA) | Resistance (Ohms) | Power (Watts) |
| --- | --- | --- | --- | --- |
| −0.1 | −1.24 | 1.24 | 12.40 | 0.12 |
| −0.2 | −1.26 | 1.50 | 6.30 | 0.25 |
| −0.3 | −1.28 | 1.60 | 4.27 | 0.38 |
| −0.4 | −1.29 | 1.70 | 3.23 | 0.52 |
| −0.5 | −1.30 | 1.70 | 2.60 | 0.65 |
| −1.0 | −1.33 | 2.30 | 1.33 | 1.33 |
| −1.5 | −1.36 | 3.60 | 0.91 | 2.04 |
| −2.0 | −1.37 | 5.70 | 0.69 | 2.74 |
| −3.0 | −1.40 | 14.90 | 0.47 | 4.20 |
| −4.0 | −1.41 | 52.00 | 0.35 | 5.64 |
| −5.0 | −1.42 | 91.00 | 0.28 | 7.10 |

It was determined that for the FET 502, the drain clamping voltage breakpoint for low currents is about −1.20V, and that the channel resistance is about 37 milliohms for the FET 502. At low currents it appears that the gate 518 is not conducting current, thus, operation of the FET 502 is a result of a channel effect. However, as the drain current ($I_d$) increases, the drain-source voltage ($V_{ds}$) increases in absolute value (becomes more negative) and approaches the magnitude of the gate voltage.

Accordingly, it can be seen that a compound semiconductor FET can be used to self-commutate transient currents during the dead time delay period and can result in safe, efficient and reliable circuit operation. In some embodiments, power losses incurred add approximately 0.6 W, which is about 20% to the circuit operation at an operating frequency of 750 kHz, an output voltage of 1.00 Vdc and a load current of 20 A.

The following are a set of prophetic examples of circuit design techniques for using a depletion mode compound semiconductor FET coupled to transient source for clamping transients:

In some embodiments, the ON/OFF swing of the gate-source voltage may be maintained as small as practical for sync FET 112. A $V_{gs(OFF)}$ of −3V and a $V_{gs(ON)}$ of ≈0.2V may be used for a 20A circuit application.

The $V_{gate}$ bias supply may be bypassed. Several decades of low ESR ceramic capacitors (e.g. 0.1 uF, 0.01 uF, 0.001 uF and 100 pF) of at least 0805 size may be used to reduce the net impedance of the bypass capacitance below resonance during the time interval ($t_{dt}$.)

A shorter time interval $t_{dt}$ may reduce switching power. The compound semiconductor FET may have very fast switching times. In some embodiments, $t_{ON}$ and $t_{OFF}$ are less than 5 ns. In some embodiments it is possible to reduce the dead time interval, $t_{dt}$, to less than 10 ns.

Reducing the clamping losses to less than 750 mW by minimizing $V_{clamp}$ and $t_{dt}$ may help to avoid catastrophic thermal damage to the device and insure reliable operation.

The circuit 100 is configured as an output stage for a DC-DC convertor including an inductor and is illustrative of use of a compound semiconductor FET in a circuit including transient sources. However, other circuits that include transient sources may include a compound semiconductor FET for suppressing and/or clamping transients.

Figure 6:
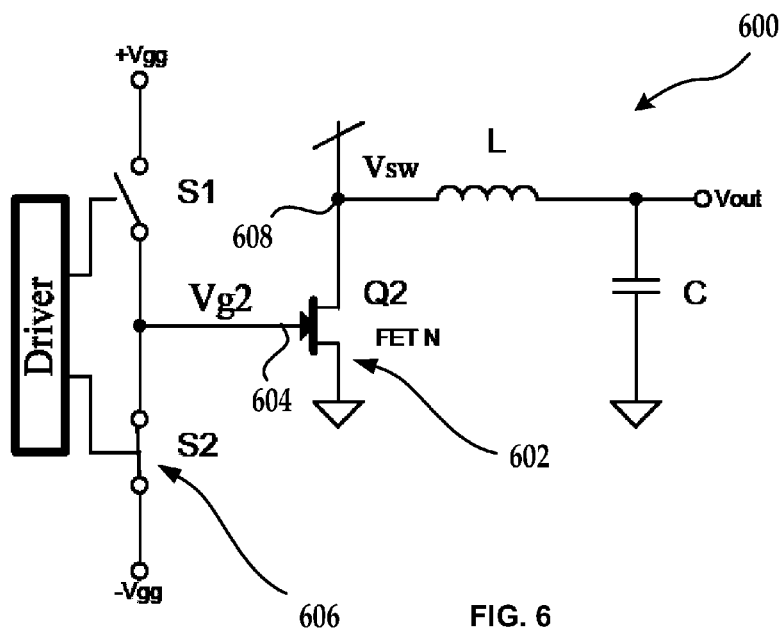
FIG. 6 is a block diagram illustrating an alternative embodiment of a circuit for a synchronous CSFET active clamp in accordance with various embodiments of the invention.

FIG. 6 is a block diagram illustrating an alternative embodiment of a circuit 600 for a synchronous CSFET active clamp 602 in accordance with various embodiments of the invention. The circuit 600 of FIG. 6 uses a fixed negative gate bias (−Vgg) at gate 604, which is provided by a semiconductor switch 606 (S2) to achieve a clamping level at the switching node 608 (Vsw).

Figure 7:
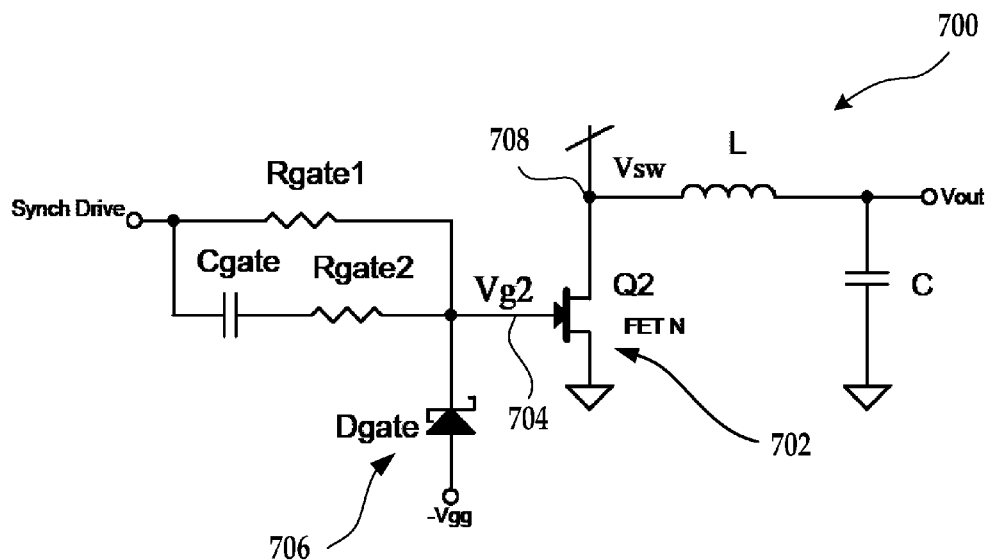
FIG. 7 is a block diagram illustrating an alternative embodiment of a circuit for a synchronous CSFET active clamp, in accordance with various embodiments of the invention.

FIG. 7 is a block diagram illustrating an alternative embodiment of a circuit 700 for a synchronous CSFET active clamp 702, in accordance with various embodiments of the invention. The circuit 700 of FIG. 7 uses a gate-side negative gate bias (−Vgg) provided to the gate 704 using a Schottky diode at clamping diode 706 (Dgate) to achieve a clamping level at the switching node 708 (Vsw).

Figure 8:
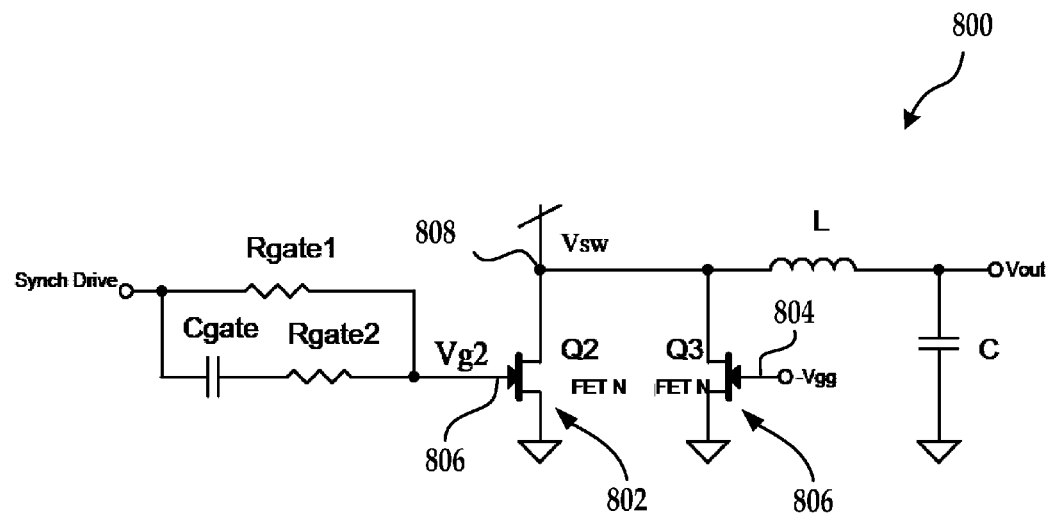
FIG. 8 is a block diagram illustrating an alternative embodiment of a circuit for a synchronous CSFET active clamp, in accordance with various embodiments of the invention.

FIG. 8 is a block diagram illustrating an alternative embodiment of a circuit 800 for a synchronous CSFET active clamp 806, in accordance with various embodiments of the invention. The circuit 800 of FIG. 8 uses a second compound semiconductor device for the active CSFET 806 (Q3) in parallel with a synchronous switch device 802 (Q2). The active clamp CSFET 806 is configured to achieve a clamping level at the switching node 808 (Vsw). The active clamp CSFET 806 may be provisioned with a fixed negative gate bias (−Vgg) at gate 804 and may be provisioned to freely switch ON/OFF such that a clamping function is decoupled from the synchronous switch device 802. The embodiment illustrated in FIG. 8 may be useful for reducing power losses due to the synchronous switch device 802.

Figure 9:
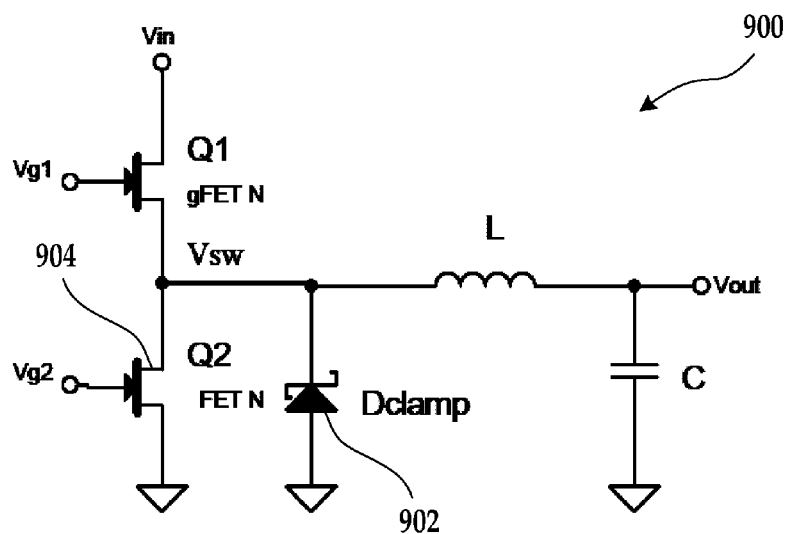
FIG. 9 is a block diagram illustrating an alternative embodiment of a buck DC-DC converter output stage using a compound semiconductor FET for device and blocking diode.

FIG. 9 is a block diagram illustrating an alternative embodiment of a buck DC-DC converter output stage 900 using a compound semiconductor FET for device 904 and blocking diode 902. A compound semiconductor FET such as a GaAs FET is generally not used for device 904 in rectified step-down buck DC-DC converter circuits 900 or other circuits that include transient sources such as inductors because a GaAs FET does not include an intrinsic body diode for blocking current surges. In some embodiments, a blocking diode 902 may be provisioned in a CSFET during fabrication of the device 904. Similarly, a blocking diode 902 may be used as an additional component in the circuit design 900. However, these alternatives may result in increased cost, complexity, size, and parts count of the circuit 900.

As used in this specification, the terms "include," "including," "for example," "exemplary," "e.g.," and variations thereof, are not intended to be terms of limitation, but rather are intended to be followed by the words "without limitation" or by words with a similar meaning. Definitions in this specification, and all headers, titles and subtitles, are intended to be descriptive and illustrative with the goal of facilitating comprehension, but are not intended to be limiting with respect to the scope of the inventions as recited in the claims. Each such definition is intended to also capture additional equivalent items, technologies or terms that would be known or would become known to a person having ordinary skill in this art as equivalent or otherwise interchangeable with the respective item, technology or term so defined. Unless otherwise required by the context, the verb "may" indicates a possibility that the respective action, step or implementation may be performed or achieved, but is not intended to establish a requirement that such action, step or implementation must be performed or must occur, or that the respective action, step or implementation must be performed or achieved in the exact manner described.

The above description is illustrative and not restrictive. This patent describes in detail various embodiments and implementations of the present invention, and the present invention is open to additional embodiments and implementations, further modifications, and alternative constructions. There is no intention in this patent to limit the invention to the particular embodiments and implementations disclosed; on the contrary, this patent is intended to cover all modifications, equivalents and alternative embodiments and implementations that fall within the scope of the claims. Moreover, embodiments illustrated in the figures may be used in various combinations. Any limitations of the invention should, therefore, be determined not with reference to the above description, but instead should be determined with reference to the appended claims along with their full scope of equivalents.

What is claimed is:

1. A circuit comprising:
   a transient voltage source; and
   a Field Effect Transistor (FET) including a compound semiconductor layer forming:
   a drain coupled to the transient voltage source,
   a source, and
   a gate,
   the gate and the drain configured to clamp voltage transients from the transient voltage source independent of a clamping diode between the source and the drain.

2. The circuit of claim 1, wherein the transient voltage source is an inductor.

3. The circuit of claim 1, wherein the material of the compound semiconductor is gallium arsenide.

4. The circuit of claim 1, wherein the FET is a depletion mode FET.

5. The circuit of claim 1, wherein the transient voltage source is configured to apply a transient voltage to the drain that is less than a pinch off voltage of the gate.

6. The circuit of claim 5, wherein the gate is configured to reduce resistance between the drain and the source in response to the transient voltage at the drain.

7. The circuit of claim 1, wherein the FET is a sync FET, and further comprising a control FET, the sync FET and the control FET configured as components of a voltage converter circuit.

8. The circuit of claim 7, wherein the sync FET is a depletion mode FET and the control FET is an enhancement mode FET.

9. The circuit of claim 7, further comprising a driver configured to switch the control FET off and switch the sync FET on less than about 30 ns after switching the control FET off.

10. The circuit of claim 9, wherein the source and the drain are configured to clamp voltage transients from the transient voltage source during a time between switching the control FET off and switching the sync FET on.

11. A circuit comprising:
    an inductor configured to produce a transient voltage; and
    a body diode-less FET including a source, a gate and a drain fabricated as a depletion mode device in a compound semiconductor, the drain of the FET configured to receive the transient voltage from the inductor and drive the gate in response to the transient voltage to reduce resistance between the drain and the source and provide a low resistance path to ground for clamping the transient voltage.

12. The circuit of claim 11, wherein the material of the compound semiconductor is gallium arsenide.

13. The circuit of claim 11, wherein a channel is configured for clamping the transient voltage independent of a clamping diode between the source and the drain.

14. The circuit of claim 11, further comprising a driver circuit configured to switch the body diode-less FET on after switching off a control device coupled to the inductor that causes the inductor to produce the transient voltage.

15. The circuit of claim 14, wherein the driver circuit is fabricated on a same substrate as the body diode-less FET.

16. The circuit of claim 14, wherein a reduction of the resistance between the source and the drain occurs during a time between switching off the control device and switching on the FET.

17. The circuit of claim 16, wherein the time between switching off the control device and switching on the FET is less than about 20 ns.

18. A converter circuit comprising:
    an enhancement mode control FET fabricated using gallium arsenide;
    a depletion mode sync FET coupled to the control FET, the sync FET fabricated using gallium arsenide; and
    an inductor configured to couple a transient voltage to a source of the control FET and a drain of the sync FET.

19. The converter circuit of claim 18, wherein the sync FET is configured to clamp the transient voltage at the drain of the sync FET independent of a clamping diode between a source and the drain of the sync FET.

20. The converter circuit of claim 19, wherein the sync FET is further configured to operate without of a body diode disposed within the sync FET during fabrication of the sync FET.

21. The converter circuit of claim 18, wherein the converter circuit is configured as a portion of buck converter circuit.

22. The converter circuit of claim 18, wherein the control FET and the sync FET are disposed on a single piece of gallium arsenide.

23. The converter circuit of claim 18, further comprising a driver circuit configured to switch the control FET off and then switch the sync FET on less than about 30 ns after switching the control FET off.

24. The converter circuit of claim 23, wherein the source and the drain of the sync FET are configured to clamp voltage transients from the inductor during a time between switching the control FET off and switching the sync FET on.

25. The converter circuit of claim 23, wherein the driver, the control FET and the sync FET are fabricated using a single piece of gallium arsenide.

* * * * *